United States Patent
Yeh et al.

(10) Patent No.: US 6,619,536 B2
(45) Date of Patent: Sep. 16, 2003

(54) SOLDER PROCESS AND SOLDER ALLOY THEREFOR

(75) Inventors: Shing Yeh, Kokomo, IN (US); Scott D. Brandenburg, Kokomo, IN (US); Bradley H. Carter, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/379,753

(22) Filed: Mar. 5, 2003

(65) Prior Publication Data

US 2003/0155402 A1 Aug. 21, 2003

Related U.S. Application Data

(62) Division of application No. 10/075,979, filed on Feb. 15, 2002, now Pat. No. 6,570,260.

(51) Int. Cl.⁷ .......................... B23K 31/02; H01L 21/44
(52) U.S. Cl. ............... 228/180.22; 228/245; 228/248.1; 438/614
(58) Field of Search ........................ 228/180.22, 245, 228/246, 248.1, 248.5, 254, 256; 438/613, 614; 257/737, 738

(56) References Cited

U.S. PATENT DOCUMENTS

| | | | | |
|---|---|---|---|---|
| 4,872,047 A | * | 10/1989 | Fister et al. ................. 257/747 |
| 5,120,498 A | * | 6/1992 | Cocks ......................... 420/580 |
| 5,415,944 A | | 5/1995 | Kazem-Goudarzi et al. .......................... 428/567 |
| 5,427,865 A | | 6/1995 | Mullen, III et al. ......... 428/559 |
| 5,476,726 A | * | 12/1995 | Harada et al. ............... 428/643 |
| 5,964,395 A | * | 10/1999 | Glovatsky et al. ....... 228/123.1 |
| 6,033,488 A | | 3/2000 | An et al. ....................... 148/24 |
| 6,047,876 A | * | 4/2000 | Smith ....................... 228/111.5 |
| 6,137,690 A | * | 10/2000 | Carson et al. ............... 361/779 |
| 6,176,947 B1 | | 1/2001 | Hwang et al. ............... 148/400 |
| 6,180,055 B1 | * | 1/2001 | Tetsuro ........................ 420/560 |
| 6,296,722 B1 | * | 10/2001 | Nishimura .................. 148/400 |
| 6,569,262 B1 | * | 5/2003 | Shohji .......................... 148/24 |
| 6,570,260 B1 | * | 5/2003 | Yeh et al. .................... 257/778 |
| 2002/0009384 A1 | * | 1/2002 | Habu et al. | |
| 2002/0106302 A1 | * | 8/2002 | Habu et al. | |
| 2002/0150787 A1 | * | 10/2002 | Yoshitome et al. | |

* cited by examiner

*Primary Examiner*—Tom Dunn
*Assistant Examiner*—Kiley Stoner
(74) *Attorney, Agent, or Firm*—Jimmy L. Funke; Stefan V. Chmielewski

(57) ABSTRACT

A solder alloy containing indium, lead, silver and copper as its alloying constituents, and a soldering process employing the solder alloy. The solder alloy consists essentially of, by weight, about 50% to about 65% indium, about 0.5% to about 3.0% silver, up to about 3.0% copper, the balance lead and incidental impurities. The alloy preferably has a solidus temperature in a range of about 173° C. to about 178° C., and a liquidus temperature in a range of about 187° C. to about 196° C. As such, the alloy can be used in a reflow process with a peak reflow temperature of about 220° C. to about 240° C., and is therefore compatible with most circuit components and can be simultaneously reflowed with 63Sn-37Pb solder.

14 Claims, 1 Drawing Sheet

SOLDER PROCESS AND SOLDER ALLOY THEREFOR

This is a division of application Ser. No. 10/075,979 filed on Feb. 15, 2002 now U.S. Pat. 6,570,260.

BACKGROUND OF THE INVENTION (1) Field of the Invention

The present invention generally relates to solder compositions of the type used with electronic packaging, such as flip chip attachment. More particularly, this invention relates to an In—Pb—Ag—Cu solder alloy having a reflow temperature that is compatible with typical circuit board assembly processes and exhibits improved reliability over commercially-available lead-based solder alloys with comparable reflow characteristics.

(2) Description of the Related Art

Surface-mount (SM) semiconductor devices such as nip chips and ball grid arrays (BGA's) are attached to circuit boards with beadlike terminals formed on interconnect pads located on one surface of the device. The terminals are typically in the form of solder bumps near the edges of the chip, and serve to both secure the chip to the circuit board and electrically interconnect the flip chip circuitry to the metal traces of a conductor pattern on the circuit board. Due to the numerous functions typically performed by the microcircuitry of flip chips and BGA's, a relatively large number of solder bumps are required. The size of a typical flip chip is generally on the order of a few millimeters per side, resulting in the solder bumps being crowded along the edges of the chip.

Flip chip interconnect pads are electrically interconnected with the circuitry on the flip chip through vias. Because aluminum metallization is typically used in the fabrication of integrated circuits, the vias (and any required runners) are also typically formed of an aluminum or aluminum alloy, which are generally unsolderable and susceptible to corrosion if left exposed. Consequently, the interconnect pad is often formed by one or more additional metal layers deposited on the flip chip to provide an interconnect surface to which a solder bump alloy will more readily wet and metallurgically bond. These additional metal layers, referred to as under bump metallurgy (UBM), may be, for example, sputtered nickel and copper, respectively, or an evaporated multilayer structure comprising an adhesion layer of aluminum or chromium, a diffusion barrier layer of a nickel-vanadium or chromium-copper alloy, and a solderable layer of copper. In each case, copper forms the outer layer of the UBM because it is readily solderable, i.e., can be wetted by and will metallurgically bond with solder alloys of the type used for solder bumps.

Because of the narrow spacing required for the solder bumps and their traces, soldering a flip chip or other SM component to a conductor pattern requires a significant degree of precision. Reflow solder techniques are widely employed for this purpose, and entail precisely depositing a controlled quantity of solder on the interconnect pads of the chip using methods such as electrodeposition and printing. Once deposited, heating the solder above its melting or liquidus temperature (for eutectic and noneutectic alloys, respectively) serves to form the solder bumps on the pads. After cooling to solidify the solder bumps, the chip is soldered to the conductor pattern by registering the solder bumps with their respective metal traces and then reheating, or reflowing, the solder so as to form solder connections that metallurgically adhere to the traces. The highest temperature attained during a reflow process in which solder bumps are reflowed to form solder connections is referred to as the peak reflow temperature, and is conventionally about 20° C. to about 50° C. above the melting or liquidus temperature of the particular solder alloy. As would be expected, controlling the width of a solder joint is necessary to prevent shorting with adjacent connections. Controlling the height of the solder joint is also necessary to prevent the molten solder from drawing the flip chip excessively close to the circuit board during the reflow operation, when the molten solder bump tends to spread outward as a result of wetting the surfaces it contacts. The ability to control solder bump height and width is determined in part by the reflow characteristics of the solder alloy used, based on its melting point (for a eutectic alloy) or solidus and liquidus temperatures (for noneutectic alloys), and the peak reflow temperatures required by the particular circuit board assembly.

The eutectic 63Sn-37Pb solder alloy (melting point of 183° C.) is the most widely used solder alloy in the electronics industry, and for process compatibility is therefore the most commonly used solder bump alloy. A typical reflow profile using the 63Sn-37Pb alloy employs a peak reflow temperature between 220° C. to 240° C., which is acceptable for nearly all circuit components. Process compatibility is important because it allows a flip chip to be attached simultaneously with other components on a circuit board. However, flip chip attachment is complicated as a result of the solder joints of a flip chip being much smaller than those of other components, and the significant mismatch in coefficients of thermal expansion (CTE) between flip chip and circuit board materials. The combination of small solder joints and CTE mismatch promote the likelihood of open solder connections as a result of solder fatigue. While underfilling flip chips and other surface-mount devices with a suitable material significantly improves solder joint fatigue resistance, this step incurs additional cost to the final product.

Alternative solder alloys have also been investigated to improve the thermal fatigue life of flip chip solder joints. Notable alloys include 10Sn-90Pb, 5Sn-95Pb, 3Sn-97Pb, and 50In-50Pb. However, the first three of these alloys require an assembly temperature of about 350° C. as a result of their high lead contents, and therefore their use is not compatible with many circuit components. A typical maximum reflow temperature for many components is about 240° C. Though higher temperature components may be available for a particular application, their cost can be prohibitive. As a solution, flip chips have been first attached with high-temperature solder alloys, followed by the attachment of other components with the 63Sn-37Pb alloy. Alternatively, the 63Sn-37Pb has been applied to circuit boards at the flip chip sites, enabling a flip chip with high-temperature solder bumps to be reflow soldered along with the other components on the circuit board. However, each of these processes incurs additional cost and time.

The above-noted 50In-50Pb solder alloy is known to have good fatigue resistance, to the extent that underfill is not required. However, the 50In-50Pb alloy is prone to electromigration which, as known in the art, is the migration of atoms in the direction of electron flux. While the fatigue resistance of the 50In-Pb50 alloy increases with increasing indium content, resistance to electromigration has been shown to decrease. Furthermore, 50In-50Pb has a liquidus temperature of 212° C., necessitating an assembly reflow temperature of about 250° C. to 260° C. This disadvantage can be addressed by using two-step reflow process or components with higher temperature ratings as discussed above, though with the noted additional costs.

Low-temperature components have been successfully attached with the 50In-50Pb alloy using reflow temperatures of about 240° C. to 250° C., however, there can be an adverse impact on product reliability, and this reflow temperature range is too low to adequately reflow 50In-50Pb solder bumps on flip chips.

In view of the above, it would be desirable if a solder bump alloy were available that exhibited improved fatigue resistance and good electromigration resistance, yet could be reflowed in the presence of other components on the same circuit board. It would be particularly desirable if such improvements could be obtained with a solder alloy requiring a peak reflow temperature between 220° C. to 240° C., allowing a flip chip to be attached with the solder while other components are simultaneously attached with 63Sn-37Pb solder alloy or another low-temperature solder alloy.

BRIEF SUMMARY OF THE INVENTION

The present invention is directed to a solder alloy containing indium, lead, silver and copper as its alloying constituents, and a soldering process employing the solder alloy. The solder alloy consists essentially of, by weight, about 50% to about 65% indium, about 0.5% to about 3.0% silver, up to about 3.0% copper, the balance lead and incidental impurities. The solder alloy of this invention is noneutectic, and therefore characterized by solidus and liquidus temperatures. The alloy preferably has a solidus temperature in a range of about 173° C. to about 178° C., and a liquidus temperature in a range of about 187° C. to about 196° C. As such, the alloy can be used in a reflow process with a peak reflow temperature of about 220° C. to about 240° C., which is compatible with most circuit components and allows for the use of a reflow profile essentially the same or identical to the widely-used 63Sn-37Pb solder alloy.

According to the invention, the solder alloy exhibits excellent fatigue resistance and electromigration resistance. In particular, the indium content of the alloy significantly improves the fatigue resistance over that of the 63Sn-37Pb solder alloy, while improved electromigration resistance is attributable to the addition of silver and optionally copper to the alloy, and to a layer of silver-indium and/or copper-indium intermetallic compound (IMC) that forms when the alloy is reflowed. During reflow to form a solder bump on an interconnect pad (such as a UBM of a flip chip), the IMC layer develops at the surface of the pad (UBM) and remains as a barrier layer between the pad (UBM) and the bulk of the solder alloy when the solder bump is reflowed to form a solder joint that metallurgically joins the interconnect pad to a metal trace on a circuit board. The IMC layer is believed to act as a current spreader, thus reducing current density in the solder joint connection, with the result that resistance to electromigration is increased. In addition, the solder electromigration process is further slowed if the solder bump contains sufficient silver and/or copper to be saturated therewith.

In view of the above, the solder alloy of this invention can be seen to improve flip chip reliability by improving resistance to solder fatigue and electromigration, both of which are important factors in flip chip solder joint reliability. Also in accordance with the above, the solder alloy of this invention can be reflowed in the presence of other circuit components on the same circuit board, and furthermore can be used to attach a flip chip while other components are being simultaneously attached with 63Sn-37Pb solder alloy or another low-temperature solder alloy.

Other objects and advantages of this invention will be better appreciated from the following detailed description.

DETAILED DESCRIPTION OF THE INVENTION

Figure 1:
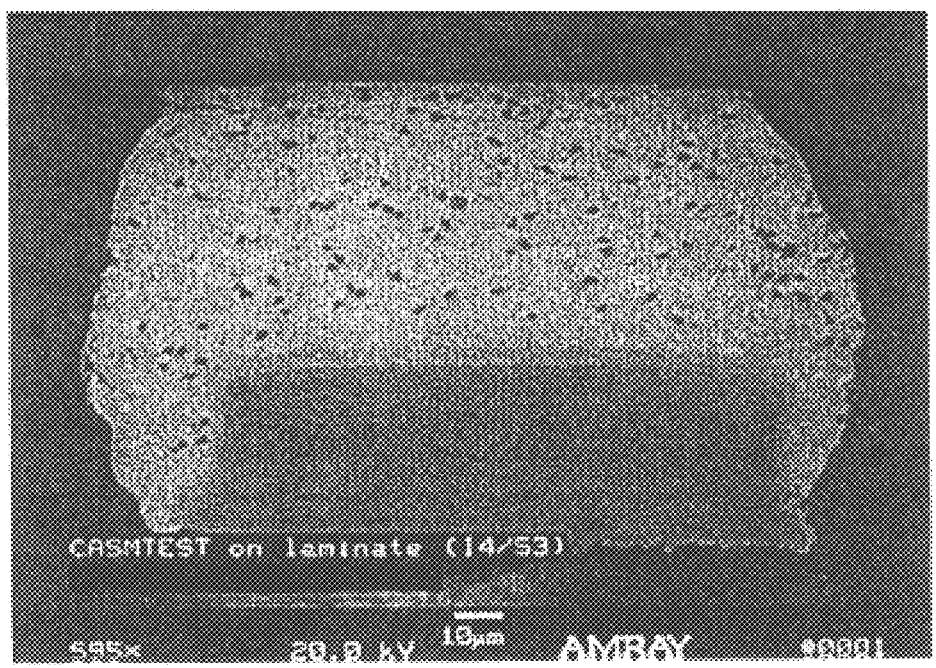
FIG. 1 is a photomicrograph of a cross-section through a solder bump formed of 55In-45Pb solder alloy.

The invention is an improvement over the eutectic 63Sn-37Pb solder alloy and commercially-available InPb solder alloys for applications such as solder joint connections for flip chips and other integrated circuit devices. The invention is particularly useful when attaching flip chips to laminate circuit boards, such as the organic-based circuit board known in the industry as FR-4, though chip attachment to other substrates, such as flexible circuits and ceramic or silicon substrates, is also within the scope of this invention. In a typical application, a flip chip solder joint interconnects a via or runner on a chip with a copper trace on circuit board, thereby electrically and mechanically connecting the chip to the board. If the via or runner is formed of aluminum, which is not readily solderable, a UBM is deposited on the via or runner to define an interconnect pad. The improvements made possible with the solder alloy of this invention arise from the improved resistance to fatigue and electromigration of a flip chip solder joint form of the alloy.

The starting point of the invention was indium-lead solder alloys containing about 55 to 60 weight percent indium. These alloys do not exhibit acceptable resistance to electromigration at high temperatures, to the extent that their use for solder bump connections would be limited to very low current applications only. According to the invention, improved electromigration resistance is made possible with the addition of silver and optionally copper. The In—Pb—Ag—Cu alloy of this invention consists essentially of, by weight, about 50% to 65% indium, about 0.5% to about 3.0% silver, up to about 3.0% copper, with the balance essentially lead (about 29% to about 49.5%) and incidental impurities. In this compositional range, the alloy has a solidus temperature of about 173° C. to about 178° C., preferably about 175° C., and a liquidus temperature of about 187° C. to about 196° C., preferably about 195° C. A preferred composition for the alloy is, by weight, about 53.5% to about 54.5% indium, about 1.0% to about 2.0% silver, about 1.0 to about 2.0% copper, with the balance essentially lead. In the form of a solder joint for an integrated circuit device such as a flip chip, the solder alloy of this invention exhibits excellent fatigue resistance and good electromigration resistance, and in addition has a melting range that enables flip chip attachment using a reflow profile typical for the 63Sn-37 Pb solder alloy, including a peak reflow temperature between about 220° C. to 240° C. As such, flip chips attached with the solder alloy of this invention can be simultaneously reflowed with other surface-mount components using the 63Sn-37Pb alloy or another comparable low-temperature alloy.

In an investigation leading to this invention, the following alloys were formulated by adding silver and copper to a base alloy containing indium and lead. The 55In-45Pb alloy (Alloy A) was viewed as a baseline alloy for the remaining alloys.

TABLE I

| Alloy Designation | Composition (wt. %) | | | |
|---|---|---|---|---|
| | In | Pb | Ag | Cu |
| A | 55.0 | 45.0 | — | — |
| B | 54.0 | 45.0 | 1.0 | — |
| C | 54.0 | 44.5 | 1.0 | 0.5 |
| D | 54.0 | 44.0 | 2.0 | — |
| E | 54.0 | 44.0 | 1.0 | 1.0 |
| F | 54.0 | 44.0 | — | 2.0 |
| G | 54.0 | 43.0 | 2.0 | 1.0 |
| H | 54.0 | 43.0 | 1.0 | 2.0 |

Solder bumps formed of the above alloys and 63Sn-37Pb solder ("SnPb") were then evaluated by die attachment to ceramic and laminate substrates using a 63Sn-37Pb reflow profile having a peak reflow temperature of about 225° C. to 236° C. The test chips used were 250×250 mils (about 6.35×6.35 mm) flip chips with 15 mil (about 0.38 mm) pitch solder connections, and underfilled as necessary for reliability with a material commercially-available from Dexter/Hysol under the name Hysol 4520. The composition of the UBM's was thin-film Al-NiV-Cu. The ceramic substrates were 35 mil-thick (about 0.9 mm) alumina, and the laminate substrates were 31 mil-thick (about 0.8 mm) FR-4. All of the solder alloys exhibited assembly yields comparable to that achieved with the 63Sn-37Pb alloy, indicating that the alloys were compatible with the 63Sn-37Pb reflow profile. Test specimens formed with Alloys A, B and C and 63Sn-37Pb solder were then assessed for thermal fatigue resistance by thermal cycling between about −50° C. and 150° C., with twenty minutes at each temperature extreme and twenty minutes in transition. Test specimens formed with Alloys A-I and 63Sn-37Pb were evaluated for electromigration resistance using a high temperature operational life (HTOL) test that employed current levels of about 625 mA per bump, an ambient temperature of about 125° C., and a junction temperature of about 150° C.

The results of the thermal cycle fatigue and HTOL tests are summarized below in Tables II and III, respectively. In Table III, "MTTF" is a "mean time to failure" value, and was based on the number of hours under test before an increase of 200 milli-ohms occurred.

TABLE II

| Alloy | Weibull Life (cycles) | Relative Reliability |
|---|---|---|
| SnPb | 850 | 1.0 |
| A | 1816 | 2.1 |
| B | 1635 | 1.9 |
| C | 2408 | 2.8 |

TABLE III

| Alloy | MTTF (hours) | Relative Reliability |
|---|---|---|
| A | 166 | 1.0 |
| B | 225 | 1.4 |
| C | 343 | 2.1 |
| D | 402 | 2.4 |
| E | 330 | 2.0 |
| F | 280 | 1.7 |
| G | 410 | 2.5 |

TABLE III-continued

| Alloy | MTTF (hours) | Relative Reliability |
|---|---|---|
| H | 320 | 1.9 |
| SnPb | 820 | 4.9 |

In general, the thermal fatigue life of InPb solders in the composition ranges tested is about two to three times that of 63Sn-37Pb solder. The improvement in reliability in thermal cycle test is within a range that might be expected in view of the indium content of Alloys A, B and C, based on the good thermal fatigue resistance exhibited by InPb alloys. However, as previously discussed, previous InPb-based alloys have exhibited weak resistance to electromigration. As seen in Table III, the reliability of 55IN45Pb (Alloy A) is only about 20% of 63Sn-37Pb in the HTOL test. The electromigration of an InPb-based alloy is shown in Table III to be significantly increased with the addition of silver and/or copper. Alloys B through H exhibited an improvement in electromigration resistance by a factor of about 1.4 to 2.5 over the baseline Alloy A (55In-45Pb), which is indicative of an increase in reliability that would allow these alloys, and particularly Alloys C through E, G and H, to be used in many higher power applications. Based on the above data, the addition of silver alone (Alloys B and D) appears to have a significant affect on electromigration resistance, while further improvements in electromigration resistance are obtained with the addition of copper (Alloys C, E, G and H).

The improvement in electromigration resistance was determined to be the result of not only the alloy composition, but also the presence of an IMC layer discovered at the interface of the solder joints and the UBM's of the flip chips. With respect to the alloy composition, the addition of silver and/or copper led to the formation of Ag-In and/or Cu-In IMC phases in the solder joint, which were believed to inhibit the electromigration process (metal atom diffusion) through the solder joints. The Ag-In IMC phase can be seen between the thin-film UBM and the bulk of the solder joint in FIG. 2, which is a photomicrograph of a solder connection formed with Alloy B (In-45Pb-1Ag). In those alloys further containing copper (Alloys C, E, G and H), the Cu-In IMC phase was also found, while only the Cu-In IMC phase was found in Alloy F, to which only copper was added. In contrast, no IMC layer is present in the solder joint of FIG. 1, which is a photomicrograph of a solder connection formed with the baseline Alloy A (In-45Pb).

Figure 2:
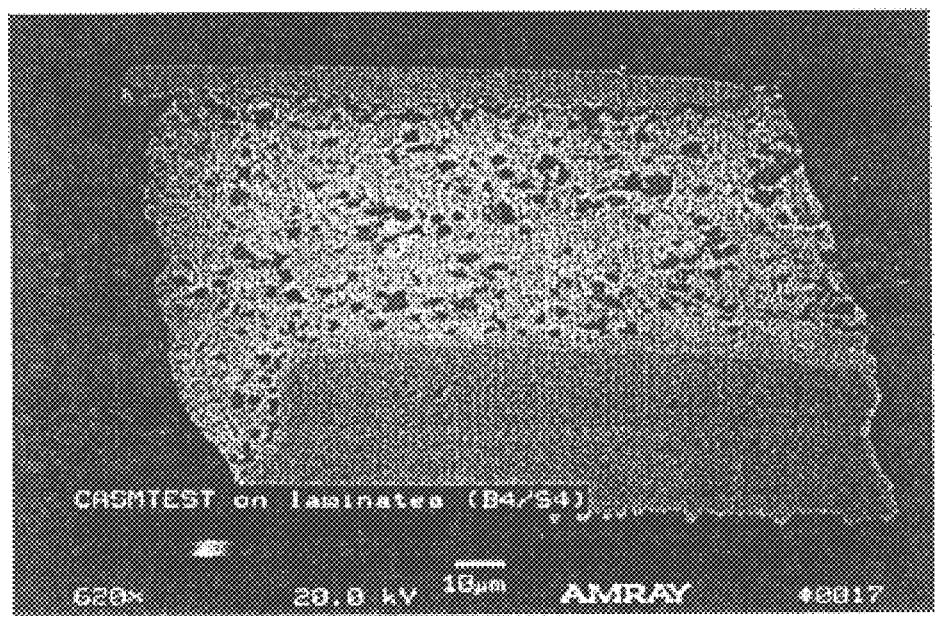
FIG. 2 is a photomicrograph of a cross-section through a solder bump formed of an In—Pb—Ag—Cu solder alloy of the present invention.

A direct relationship is known to exist between electromigration and current density. For a conventional interconnect structure of the type shown in Figure, as a result of the limited thickness of the UBM, the critical area for electromigration is that of the via that electrically connects the UBM with circuitry on the flip chip. Each of the interconnect structures shown in FIGS. 1 and 2 has a via with a diameter of about 4 mils (about 100 micrometers) and a UBM with a diameter of about 6 mils (about 150 micrometers). The IMC layer in FIG. 2 has a diameter equal to the diameter of the UBM, i.e., about 6 mils (about 150 micrometers), and a thickness of about 10 micrometers. The combined thickness of the UBM and IMC layer of FIG. 2 is believed to produce a current-spreading effect, such that the critical area for electromigration in the joint structure of FIG. 2 is at the interface between the IMC layer and the remaining bulk of the solder joint. This interface area (corresponding to the 6 mils diameters of the UBM and IMC layer) is much larger than the interface area between the UBM and via (corresponding to the 4 mils diameters of the vias). Because of the relationship between electromigration and current density, it is believed that the HTOL lives of the solder alloys of this invention were due at least in part to the IMC layers reducing the current densities at the critical areas of their interconnections. While a similar effect may be possible by directly depositing a silver or copper mini-bump as the UBM prior to solder deposition and reflow, the disadvantages would include additional masking, deposition (e.g., plating) and stripping steps, which would add significant manufacturing costs.

While the invention has been described in terms of a preferred embodiment, it is apparent that other forms could be adopted by one skilled in the art. Accordingly, the scope of the invention is to be limited only by the following claims.

What is claimed is:

1. A soldering process comprising the steps of:
    depositing on an interconnect pad of an integrated circuit device a solder alloy consisting essentially of, by weight, about 50% to about 60.0% indium, about 0.5% to about 3.0% silver, 0.0% to about 3.0% copper, the balance lead and incidental impurities; and then
    reflowing the solder alloy to form a solder bump on the interconnect pad, the solder bump comprising a layer of silver-indium and/or copper-indium intermetallic compound contacting the interconnect pad as a result of the reflowing step.
2. A soldering process according to claim 1, wherein the solder alloy has a solidus temperature in a range of about 173° C. to about 178° C.
3. A soldering process according to claim 1, wherein the solder alloy has a liquidus temperature in a range of about 187° C. to about 196° C.
4. A soldering process according to claim 1, wherein the silver content is about 1.0 to about 2.0 weight percent of the solder alloy, and the copper content is about 1.0 to about 2.0 weight percent of the solder alloy.
5. A soldering process according to claim 1, wherein the silver content is about 1.0 weight percent of the solder alloy, and the copper content is about 0.5 to about 2.0 weight percent of the solder alloy.
6. A soldering process according to claim 1, wherein the silver content is about 2.0 weight percent of the solder alloy, and the copper content is up to about 2.0 weight percent of the solder alloy.
7. A soldering process according to claim 1, wherein the indium content is about 53.5 to about 54.5 weight percent of the solder alloy.
8. A soldering process according to claim 1, further comprising the step of registering the solder bump with a metal trace on a laminate substrate, and then reflowing the solder bump to form a solder joint that metallurgically joins the interconnect pad to the metal trace so as to attach the integrated circuit device to the laminate substrate.
9. A soldering process according to claim 8, wherein the layer of silver-indium and/or copper-indium intermetallic compound contacts the interconnect pad following the step of reflowing the solder bump.
10. A soldering process comprising the steps of:
    depositing on an interconnect pad of an integrated circuit device a solder alloy consisting essentially of, by weight, 50% to 65% indium, 0.5% to 3.0% silver, 0.0% to 3.0% copper, the balance lead and incidental impurities, the solder alloy having a solidus temperature in a range of about 173° C. to about 178° C. and a liquidus temperature in a range of about 187° C. to about 196° C.;
    reflowing the solder alloy to form a solder bump on the interconnect pad, the solder bump comprising a layer of silver-Indium and/or copper-indium intermetallic compound contacting the interconnect pad as a result of the reflowing step;
    registering the solder bump with a metal trace on a laminate substrate; and then
    reflowing the solder bump to form a solder joint that metallurgically joins the interconnect pad to the metal trace so as to attach the integrated circuit device to the laminate substrate, the layer of silver-indium and/or copper-indium intermetallic compound contacting the interconnect pad.
11. A soldering process according to claim 10, wherein the silver content is about 1.0 to about 2.0 weight percent of the solder alloy, and the copper content is about 1.0 to about 2.0 weight percent of the solder alloy.
12. A soldering process according to claim 10, wherein the silver content is about 1.0 weight percent of the solder alloy, and the copper content is about 0.5 to about 2.0 weight percent of the solder alloy.
13. A soldering process according to claim 10, wherein the silver content is about 2.0 weight percent of the solder alloy, and the copper content is up to about 2.0 weight percent of the solder alloy.
14. A soldering process according to claim 10, wherein the indium content is about 53.5 to about 54.5 weight percent of the solder alloy.

* * * * *